(12) United States Patent
Patil et al.

(10) Patent No.: US 6,881,677 B1
(45) Date of Patent: Apr. 19, 2005

(54) METHOD FOR MAKING A MICRO-FLUID EJECTION DEVICE

(75) Inventors: Girish Shivaji Patil, Lexington, KY (US); Karthik Vaideeswaran, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/803,009

(22) Filed: Mar. 17, 2004

(51) Int. Cl.[7] .................... H01L 21/302; H01L 21/461
(52) U.S. Cl. .................... 438/706; 438/689; 438/694; 438/708; 438/778
(58) Field of Search ................. 438/689, 694, 438/706, 758, 778, 669, 673, 637, 639, 734

(56) References Cited

U.S. PATENT DOCUMENTS

| | | | |
|---|---|---|---|
| 5,385,809 A | | 1/1995 | Bohrer et al. |
| 5,970,376 A | * | 10/1999 | Chen ........................... 438/637 |
| 6,020,255 A | * | 2/2000 | Tsai et al. .................... 438/618 |
| 6,207,353 B1 | | 3/2001 | Armacost et al. |
| 6,265,134 B1 | | 7/2001 | Varanasi et al. |
| 6,346,474 B1 | * | 2/2002 | Liu ............................. 438/633 |
| 6,365,321 B1 | | 4/2002 | Chen et al. |
| 6,365,325 B1 | * | 4/2002 | Chiang et al. ............... 430/313 |
| 6,593,056 B2 | | 7/2003 | Takeda et al. |
| 6,635,400 B2 | | 10/2003 | Kato et al. |
| 2003/0024902 A1 | * | 2/2003 | Li et al. ........................ 216/67 |
| 2004/0007325 A1 | * | 1/2004 | Pan et al. ................ 156/345.1 |
| 2004/0097001 A1 | * | 5/2004 | Hsieh et al. .................. 438/50 |
| 2004/0206621 A1 | * | 10/2004 | Li et al. ................... 204/229.8 |

FOREIGN PATENT DOCUMENTS

WO  WO 03/075092  9/2003

* cited by examiner

Primary Examiner—Amir Zarabian
Assistant Examiner—Thanh Y. Tran
(74) Attorney, Agent, or Firm—Luedeka, Neely & Graham, P.C.

(57) ABSTRACT

A method for forming a fluid feed via in a semiconductor substrate chip for a micro-fluid ejection head. The method includes applying a photoresist planarization and protection layer to a first surface of the chip. The photoresist planarization and protection layer is patterned and developed to define at least one fluid feed via location. A strippable layer is applied to the photoresist planarization and protection layer on the chip. The strippable layer is patterned and developed with a photomask to define the at least one fluid feed via location in the strippable layer. The chip is then dry etched to form at least one fluid feed via in the defined feed via location. Before or after etching the chip, deprotection of the strippable layer is induced so that the strippable layer can be substantially removed with a solvent without substantially affecting the photoresist planarization and protection layer.

18 Claims, 4 Drawing Sheets

METHOD FOR MAKING A MICRO-FLUID EJECTION DEVICE

FIELD OF THE INVENTION

The invention relates to micro-fluid ejection devices. More particularly, the invention relates an improved method for making micro-fluid ejection devices in order to increase the yield of usable product.

BACKGROUND

Ink jet printer technology is highly dynamic and ink jet printer printheads or print engines are a key component of ink jet printer devices. The processes used to construct such printheads require precise and accurate techniques and measurements on a minute scale. Some steps in the printhead construction process are necessary but can be damaging to the printhead. Such damage to the printhead affects the quality of the printer output, and, therefore, has an affect on the value of the ink jet printer itself.

One example of a technique that can result in such damage is the removal of an etch mask layer from the planarization and protection layer on a semiconductor chip in a given printhead. Printheads consist of a silicon substrate and a plurality of layers including passivation layers, conductive metal layers, resistive layers, insulative layers, and protective layers on the substrate. Fluid feed holes or vias are formed in the substrate and various layers in order for ink to be transferred through the vias or holes to ejection devices on a substrate surface. Such holes are often formed through the semiconductor chip using deep reactive ion etching (DRIE) or mechanical techniques such as grit blasting. A planarization and protection layer is preferably used to smooth the surface of the semiconductor chip so that it can be more securely attached to the nozzle plate. The planarization layer also functions to protect the components between the planarization and protection layer and the surface of the substrate from corrosion and may provide an adhesive surface for attaching a nozzle plate thereto.

Before holes or vias are formed in the semiconductor chip containing a planarization and protection layer, the planarization and protection layer is desirably masked by an etch mask layer. In order to complete the hole formation process, the etch mask layer must be removed. However, techniques sufficient to remove the etch mask layer also may strip away portions of the planarization and protection layer. This undesirable effect results in less protection for the semiconductor chip. If, on the other hand, less aggressive stripping of the etch mask layer is conducted, portions of the semiconductor chip are left with a white insoluble residue from the etch mask layer which makes the chips unsuitable for use. There is, therefore, a continuing need for a process that will remove substantially all of the etch mask layer without damaging the underlying planarization and protection layer.

SUMMARY OF THE INVENTION

With regard to the above and other objects the disclosure describes a method for making fluid feed vias in semiconductor silicon chips for an ejection head for a micro-fluid ejection device. In one aspect there is provided a method for making an ink feed via in a semiconductor substrate chip for an ink jet printhead. The method includes applying a photoresist planarization and protection layer to a first surface of the chip. The planarization and protection layer has an overall thickness ranging from about 1 to about 10 microns. The photoresist planarization and protection layer is patterned and developed to define at least one ink feed via location. A strippable photoresist layer is applied to the photoresist planarization and protection layer on the chip. The strippable photoresist layer has a thickness ranging from about 10 to about 100 microns. The strippable photoresist layer is patterned and developed with a photomask to define the at least one ink feed via location in the strippable photoresist layer. The chip is then dry etched to form at least one ink feed via in the defined ink feed via location. Before or after etching the chip, deprotection of the strippable photoresist layer is induced by radiant energy so that the strippable photoresist layer can be substantially removed with a solvent without substantially affecting the photoresist planarization and protection layer.

In another aspect there is provided a method for making an ink feed via in a semiconductor substrate chip for an ink jet printhead. The method includes applying a photoresist planarization and protection layer to a first surface of the chip. The planarization and protection layer has an overall thickness ranging from about 1 to about 10 microns. The photoresist planarization and protection layer is patterned and developed to define at least one ink feed via location. A strippable photoresist layer is applied to the photoresist planarization and protection layer on the chip. The strippable photoresist layer has a thickness ranging from about 10 to about 100 microns. The strippable photoresist layer is patterned and developed with a photomask to define the at least one ink feed via location in the strippable photoresist layer. The chip is then dry etched to form at least one ink feed via in the defined ink feed via location. Before or after etching the chip, deprotection of the strippable photoresist layer is induced by contacting the strippable photoresist layer with a compound selected from the group consisting essentially of an organic acid, an inorganic acid, and a positively charged species so that the strippable photoresist layer can be substantially removed with a solvent without substantially affecting the photoresist planarization and protection layer.

An advantage of certain embodiments described herein can be that the planarization and protection layer is left relatively smooth and substantially unaltered after the dry etching process and removal of the strippable photoresist layer. Unlike conventional techniques used to remove etch mask layers, the exemplary embodiments described herein provide removal of substantially all of the strippable photoresist layer, leaving essentially no residue. Moreover, the process for removal of the strippable photoresist layer does not affect or damage the planarization and protection layer as do other conventional aggressive techniques used to remove such etch mask layers.

BRIEF DESCRIPTION OF THE DRAWINGS

Further features and advantages of the embodiments described herein will become apparent by reference to the detailed description when considered in conjunction with the figures, which are not to scale, wherein like reference numbers indicate like elements through the several views, and wherein.

DETAILED DESCRIPTION OF EXEMPLARY EMBODIMENTS OF THE INVENTION

Figure 1:
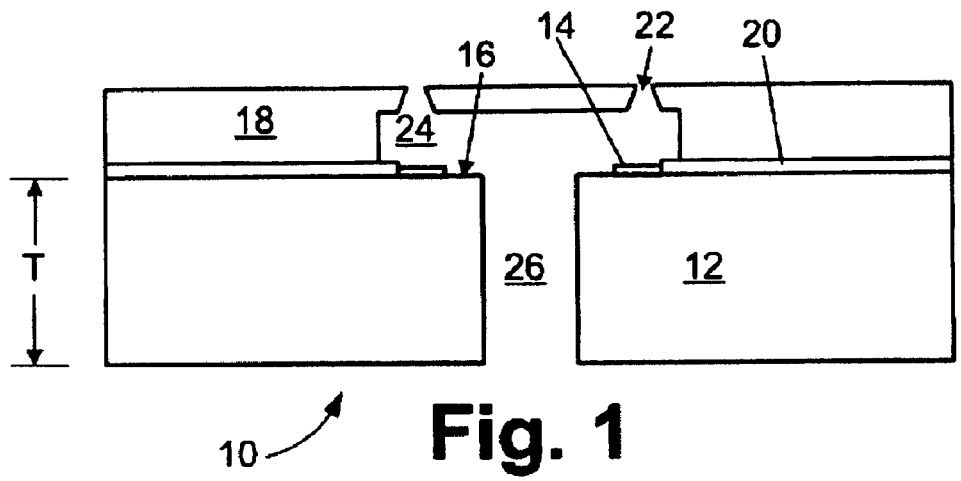
FIG. 1 is a cross-sectional view, not to scale, of a micro-fluid ejection head.
Figure 2:
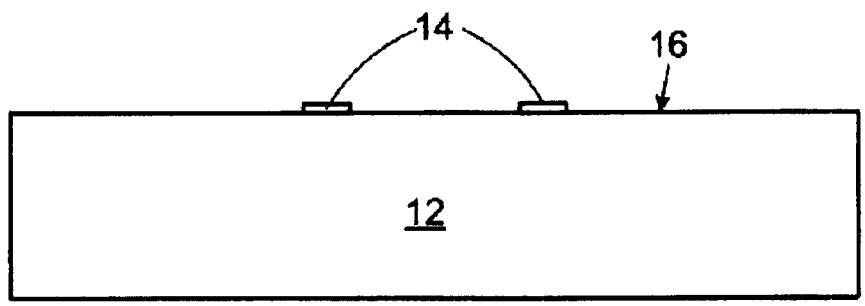
FIGS. 2–11 illustrate steps in a process for forming a micro-fluid ejection head according to one embodiment of the invention.

In one embodiment, there are provided methods for substantially removing a strippable layer, such as an etch mask layer, from a surface of a chip during a manufacturing process for making a semiconductor silicon chip used in micro-fluid ejection devices, such as ink jet printers. With reference to FIG. 1, a micro-fluid ejection head 10 for a micro-fluid ejection device such as an ink jet printer includes a semiconductor substrate layer 12, preferably made of silicon, having a thickness T. The substrate includes a plurality of fluid ejection devices such as heater resistors 14 on a surface 16 thereof. The surface of the substrate also includes various conductive, insulative and protective layers for electrically connecting the heater resistors 14 to a printer and for protecting the resistors 14 from corrosion by contact with the ink.

In order to provide a relatively planar surface for attaching a nozzle plate 18 to the substrate 12, a planarization and protection layer 20 can be applied to the surface 16 of the substrate 12. An exemplary planarization and protection layer 20 is provided by a radiation curable resin composition that may be spin-coated onto the surface 16 of the substrate 12. A particularly advantageous radiation curable resin composition includes a difunctional epoxy component, a multifunctional epoxy component, a photoinitiator, a silane coupling agent, and a nonphotoreactive solvent, generally as described in U.S. Publication No. 2003/0207209 to Patil et al., the disclosure of which is incorporated by references as if fully set forth herein. The nozzle plate 18 includes nozzle holes 22 and may include ink ejection chambers 24 laser ablated therein. In the alternative a thick film layer may be attached directly to the planarization and protection layer 20 and a nozzle plate attached to the thick film layer. In the case of a separate thick film layer, the ink chambers are typically formed in the thick film layer and the nozzle holes are formed in the nozzle plate.

An ink via 26 is formed through the thickness T of the semiconductor substrate to provide an ink flow path for flow of ink to the ink ejection chambers 24 and heater resistors 14. The ink via 26 may be provided by an elongate slot or individual holes through the thickness T of the substrate 14. Methods for making ink vias 26 are known and include mechanical abrasion, chemical etching, and dry etching techniques. A particularly advantageous method for forming an ink via 26 is a deep reactive ion etching (DRIE) process, generally as described in U.S. Pat. No. 6,402,301 to Powers et al., the disclosure of which is incorporated by reference as if fully set forth herein. While the ink via 26 is shown as having substantially vertical walls, the walls of the ink via 26 are typically slightly tapered so that the ink via 26 is wider on one end than on the other.

With reference to FIGS. 2–11, an exemplary method for making micro-fluid ejection devices according to one embodiment of the invention is illustrated. The method includes providing a substrate 12 having a thickness ranging from about 200 to about 800 microns or more. A plurality of layers including insulative, conductive, and resistive materials are deposited on the surface 16 of the substrate to provide a plurality of heater resistors 14 thereon and electrical tracing to the heater resistors 14. The substrate 12 may also include driver transistors and control logic for the resistors 14.

Figure 3:
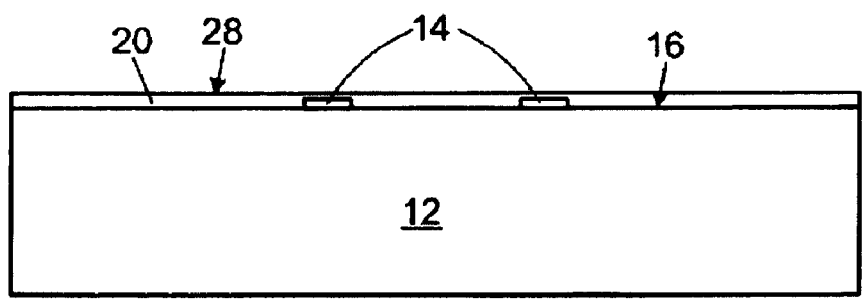

In the next step of the process, shown in FIG. 3, a planarization and protection layer 20 is applied to the surface 16 of the substrate. The planarization and protection layer can have a thickness ranging from about 1 to about 10 microns or more. Since the planarization and protection layer 20 can be spin-coated onto the substrate surface 16, the layer 20 can be made to completely cover the exposed surface 16 of the substrate 12 including the heater resistors 14 as shown. The result after the deposition of the planarization and protection layer 20 is a planarized surface 28.

Figure 4:
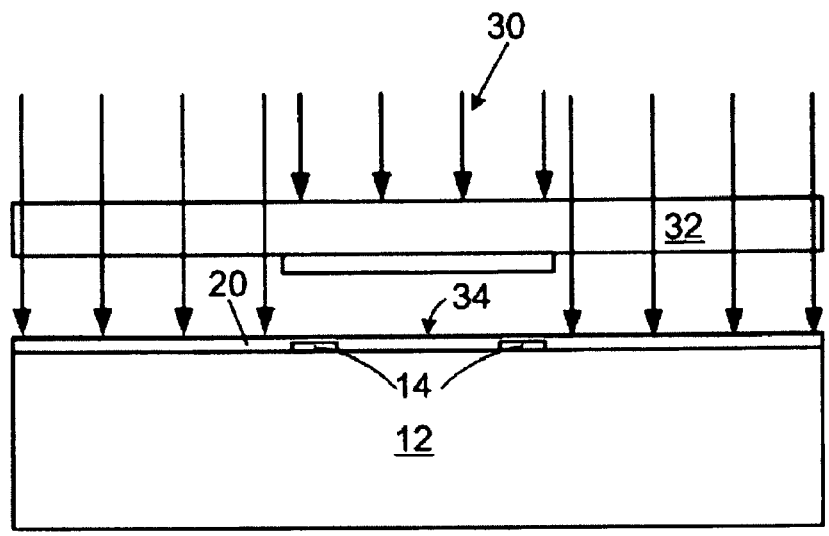
Figure 5:
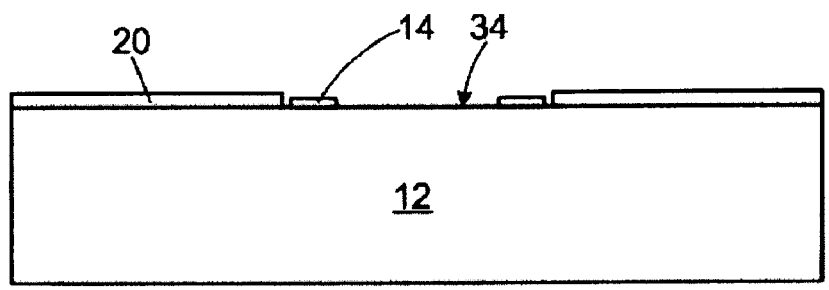

Next, with reference to FIG. 4, the planarization and protection layer 20 is photoimaged to cure selected portions of the layer 20. The selected portions of the planarization and protection layer 20 are cured using a radiation source 30 such as ultraviolet (UV) radiation. A mask 32 is used to shield one or more portions of the planarization and protection layer 20 so that the shielded portions remain uncured. The uncured portions are located in areas that are to be later developed and removed from the surface 16 of the substrate 12 so that the planarization and protection layer atop the resistors 14 is removed and the surface of the substrate is exposed in the locations 34 for the ink vias. A fully cured and developed planarization and protection layer 20 is illustrated in FIG. 5.

Figure 6:
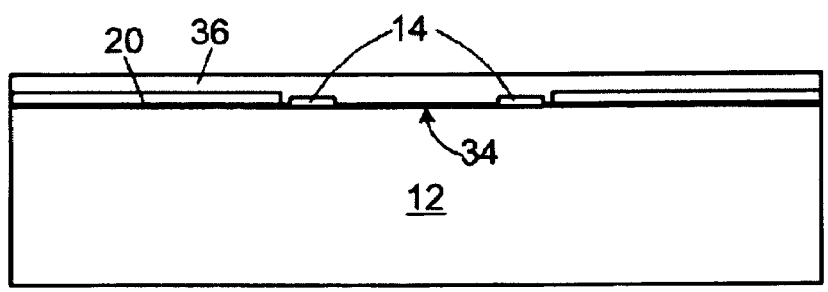

With reference to FIG. 6, a strippable masking layer 36 is then applied to the planarization and protection layer 20 and the exposed locations 34 of the substrate 12. The strippable layer 36 acts as an etch mask layer for a DRIE process for forming the ink vias 26 through the thickness T of the substrate 12. The masking layer 36 desirably has a thickness ranging from about 10 to about 100 microns, and more particularly, from about 30 to about 70 microns. The thickness of the masking layer 36 is not critical provided the thickness is sufficient to protect the planarization and protection layer 20 and heater resistors 14 during the etching process and not so thick that it inhibits a photoimaging process. The masking layer 36 can be provided by a photoresist material comprised of a polymer containing acid labile protecting groups thereon. An exemplary polymer for use as the masking layer 36 includes a protected polyhydroxystyrene material available from Shin-Etsu MicroSi, Inc. of Phoenix, Ariz. under the trade name SIPR 7121M-16, and generally described in U.S. Pat. No. 6,635,400 to Kato et al., the disclosure of which is incorporated herein by reference thereto.

Figure 7:
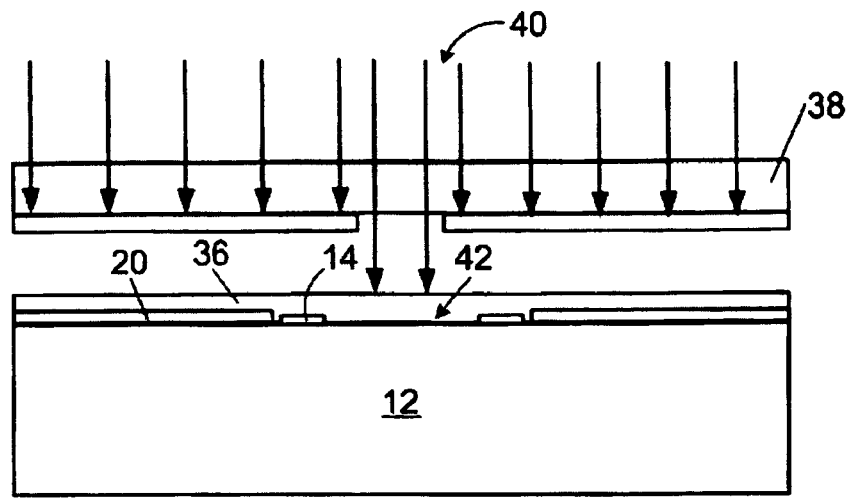
Figure 8:
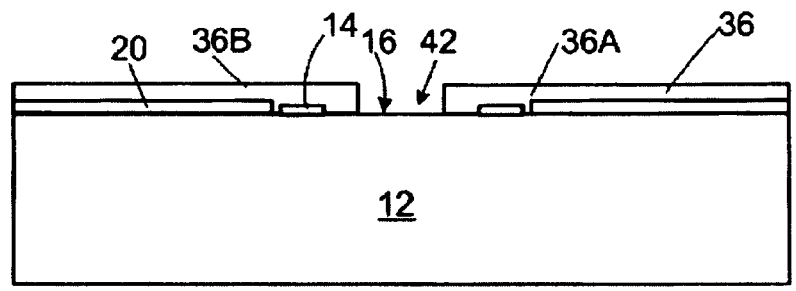

A second irradiation process as illustrated in FIG. 7 is used to remove selected portions of the strippable masking layer 36 to provide locations for forming the one or more ink feed vias through the thickness T of the substrate 12. A second mask 38 is used to photoimage the masking layer 36 using a radiation source 40 such as UV radiation. Unlike the process described with respect to FIG. 4, portions of the masking layer 36 in areas 42 subject to radiation are transformed into materials that are readily removed with a suitable solvent rather than cured to prevent removal with a solvent. In the case of a photoresist layer having acid labile protecting groups thereon, irradiation of the masking layer 36 causes deprotection of the acid labile protecting groups. Conventional developing solutions may then be used to remove portions of the masking layer 36 in areas 42 wherein the substrate surface 16 is exposed as shown in FIG. 8.

Figure 9:
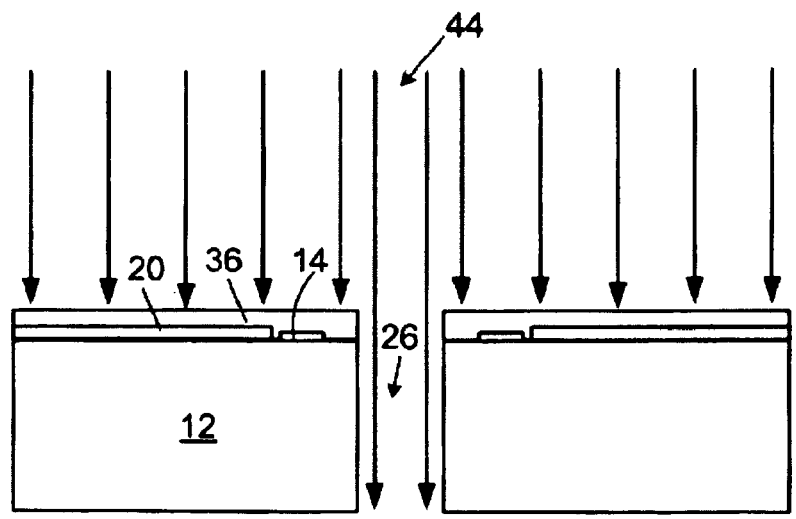

After providing the locations for the ink vias by removing portions of the masking layer 36 in areas 42, formation of the ink vias 26 is provided by DRIE 44 as described above. FIG. 9 illustrates an exemplary dry etching process used for forming the one or more ink feed vias 26 through the thickness of the substrate 12.

Figure 10:
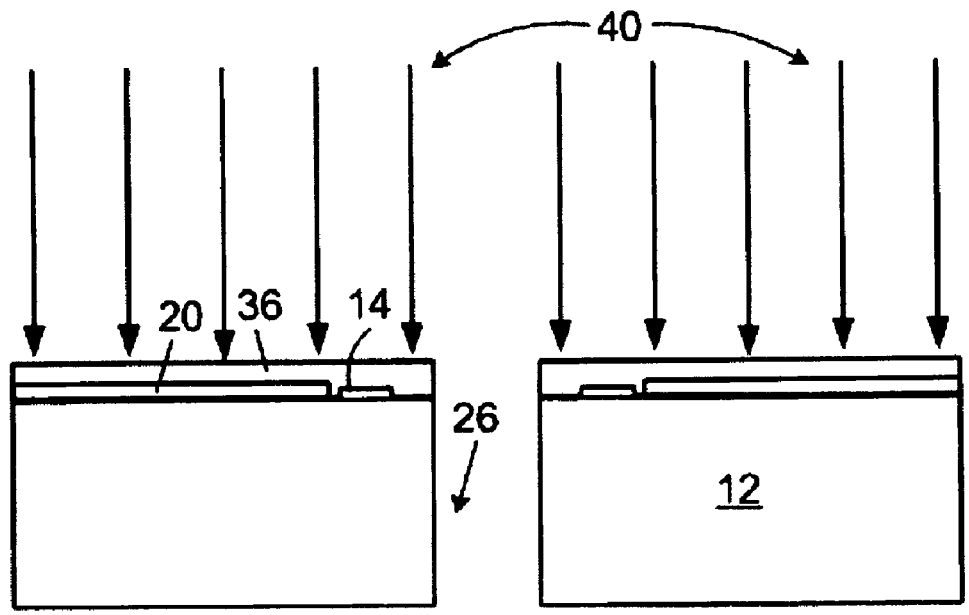
Figure 11:
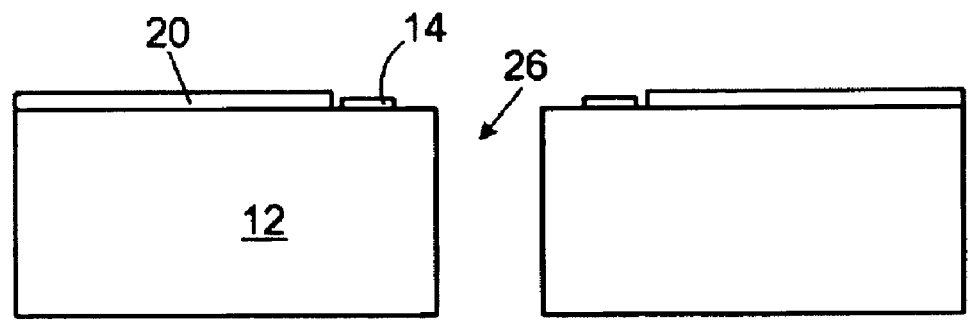

After the formation of the ink vias 26, as by etching, is complete, the strippable masking layer 36 must be removed before the nozzle plate 18 is attached to the semiconductor substrate 12 as shown in FIG. 1. One exemplary method for removing the strippable masking layer 36 is to first expose the strippable masking layer 36 to UV radiation 40 as shown in FIG. 10. In this case, all of the exposed surfaces of the substrate 12 are subject to a blanket irradiation step as shown. Exposure to UV radiation induces deprotection of the acid labile masking groups in the strippable masking layer 36 so that the layer 36 can then be cleanly removed with a solvent in which the masking layer 36 is substantially soluble while the cured planarization and protection layer 20 remains substantially unaffected by the solvent In an alternative embodiment, deprotection of the masking layer 36 may also be induced by exposing the strippable layer 36 to an organic acid, inorganic acid, or any other positively charged species capable of deprotecting the acid labile protective groups in the strippable masking layer 36. As with the radiation step described above, removal of the deprotected masking layer 36 may be achieved with a solvent that does not affect the planarization and protection layer 20. Suitable solvents include, but are not limited to, compounds in which polyhydroxystyrene is substantially soluble. Examples of such solvents include propyleneglycol monomethyletheracetate (PGMEA), cyclopentanone, N-methylpyrrolidone, tetramethyl ammonium hydroxide, acetone, isopropyl alcohol, and butyl cellosolve acetate. After the strippable masking layer 36 is removed, the planarization and protection layer is left exposed, but relatively unaltered as shown in FIG. 11. With reference to FIG. 1, a nozzle plate 18 is then attached to planarization layer 20 to provide the micro-fluid ejection head 10 described above.

Because the etching process for forming the ink via 26 does not alter or effect the strippable masking layer 36, whether or not the strippable masking layer is protected or deprotected, deprotection of the strippable masking layer may be conducted before or after the dry etching to form the ink vias 26 in the chip 12.

Having described various aspects and exemplary embodiments of the invention and several advantages thereof, it will be recognized by those of ordinary skills that the invention is susceptible to various modifications, substitutions and revisions within the spirit and scope of the appended claims.

What is claimed is:

1. A process for forming one or more fluid feed vias in a semiconductor substrate chip for a micro-fluid ejection device, the process comprising the steps of:
   (a) applying a photoresist planarization and protection layer to a first surface of the chip, the planarization and protection layer having a thickness ranging from about 1 to about 10 microns;
   (b) patterning and developing the photoresist planarization and protection layer to define at least one fluid feed via location;
   (c) applying a strippable masking layer to the photoresist planarization and protection layer of the chip, the strippable masking layer having a thickness ranging from about 10 to about 100 microns;
   (d) patterning and developing the strippable masking layer to define the at least one fluid feed via location in the strippable masking layer;
   (e) dry etching the chip to form at least one fluid feed via in the defined fluid feed via location;
   (f) inducing deprotection of the strippable masking layer before or after step (e) so that the strippable masking layer can be substantially removed without affecting the photoresist planarization and protection layer.

2. The process of claim 1 wherein the strippable masking layer comprises a photoresist polymer containing acid labile protecting groups.

3. The process of claim 2 wherein the polymer comprises a protected polyhydroxystyrene material.

4. The process of claim 1 wherein the dry etching technique comprises deep reactive ion etching.

5. The process of claim 1, wherein the deprotection step is induced by a composition selected from the group consisting of an organic acid, an inorganic acid, other positively charged species sufficient to deprotect the masking layer, and radiant energy.

6. The process of claim 5, wherein the strippable masking layer is removable with a solvent and wherein the solvent comprises any solvent in which polyhydroxystyrene is substantially soluble.

7. The process of claim 5 wherein the radiant energy comprises ultraviolet radiation.

8. A process for forming an ink feed via in a semiconductor substrate chip for an ink jet printhead, the process comprising the steps of:
   (a) applying a photoresist planarization and protection layer to a first surface of the chip, the planarization and protection layer having a thickness ranging from about 1 to about 10 microns;
   (b) patterning and developing the photoresist planarization and protection layer to define at least one ink feed via location;
   (c) applying a strippable photoresist layer to the photoresist planarization and protection layer of the chip, the strippable photoresist layer having a thickness ranging from about 10 to about 100 microns;
   (d) patterning and developing the strippable photoresist layer with a photomask to define the at least one ink feed via location in the strippable photoresist layer,
   (e) dry etching the chip to form at least one ink feed via in the defined at least one ink feed via location;
   (f) inducing deprotection of the strippable photoresist layer before or after step (e) using radiant energy so that the strippable photoresist layer can be substantially removed without affecting the photoresist planarization and protection layer.

9. The process of claim 8 wherein the strippable photoresist layer comprises a polymer containing acid labile protecting groups.

10. The process of claim 9 wherein the polymer comprises a protected polyhydroxystyrene material.

11. The process of claim 8, wherein the dry etching technique comprises deep reactive ion etching.

12. The process of claim 8, wherein the strippable photoresist layer is removed with a solvent and wherein the solvent comprises a solvent in which polyhydroxystyrene is substantially soluble.

13. The process of claim 8 wherein the radiant energy comprises ultraviolet radiation.

14. A process for forming one or more ink feed vias in a semiconductor substrate chip for use in an ink jet printhead, the process comprising the steps of:

(a) applying a photoresist planarization and protection layer to a first surface of the chip, the planarization and protection layer having a thickness ranging from about 1 to about 10 microns;

(b) patterning and developing the photoresist planarization and protection layer to define at least one ink feed via location therein;

(c) applying a strippable photoresist layer to the photoresist planarization and protection layer of the chip, the strippable photoresist layer having a thickness ranging from about 10 to about 100 microns;

(d) patterning and developing the strippable photoresist layer with a photomask to define the at least one ink feed via location in the strippable photoresist layer;

(e) dry etching the chip to form at least one ink feed via in the defined at least one ink feed via location;

(f) inducing deprotection of the strippable photoresist layer before or after step (e) using a compound selected from the group consisting of an organic acid, an inorganic acid, and other positively charged species sufficient to deprotect the strippable photoresist layer so that the strippable photoresist layer can be substantially removed with a solvent without affecting the photoresist planarization and protection layer.

15. The process of claim 14 wherein the strippable photoresist layer comprises a polymer containing acid labile protecting groups.

16. The process of claim 14 wherein the polymer comprises a protected polyhydroxystyrene material.

17. The process of claim 14 wherein the dry etching technique comprises deep reactive ion etching.

18. The process of claim 14, wherein the solvent comprises a solvent in which polyhydroxystyrene is substantially soluble.

* * * * *